United States Patent [19]
Yip et al.

[11] Patent Number: 5,656,949
[45] Date of Patent: Aug. 12, 1997

[54] ARCHITECTURE FOR FPGAS

[75] Inventors: Aaron S. Yip, Milpitas; Timothy M. Lacey, Cupertino; Anup K. Nayak, San Jose; Rajiv Nema, Sunnyvale; Han-Kim Nguyen, Newark, all of Calif.

[73] Assignee: Cypress Semiconductor Corp., San Jose, Calif.

[21] Appl. No.: 581,064

[22] Filed: Dec. 29, 1995

[51] Int. Cl.⁶ .................................................. H03K 19/177
[52] U.S. Cl. ............................... 326/38; 326/16; 326/44; 371/22.2
[58] Field of Search .................... 326/38–41, 44–45, 326/49–50, 16; 327/525; 371/22.1–22.2

[56] References Cited

U.S. PATENT DOCUMENTS

| | | | |
|---|---|---|---|
| 5,083,083 | 1/1992 | El-Ayat et al. | 326/44 |
| 5,367,207 | 11/1994 | Goetting et al. | 326/44 |
| 5,495,181 | 2/1996 | Kolze | 326/44 |
| 5,552,720 | 9/1996 | Lulla et al. | 327/525 |

*Primary Examiner*—Edward P. Westin
*Assistant Examiner*—Jon Santamauro
*Attorney, Agent, or Firm*—Blakely, Sokoloff, Taylor & Zafman, LLP

[57] ABSTRACT

A programmable circuit apparatus having a programmable circuit and an input/output circuit with a first terminal is provided. The programmable circuit apparatus includes a programming circuit, with a bus junction, for programming the programmable circuit. The programmable circuit apparatus further includes an isolation circuit having an isolation input, coupled to the first terminal, and an isolation output, coupled to the bus junction of the programming circuit. The isolation circuit further has an isolation control gate which can receive a control signal and in response to that signal, the control gate controllably couples the isolation input to the isolation output. The programmable circuit apparatus also includes an apparatus for testing the routing, the programming circuitry, and the programmable circuit with a minimal impact on the performance of the programmable circuit. The programmable circuit apparatus also has the ability to program three or more antifuses or other programmable elements simultaneously.

22 Claims, 6 Drawing Sheets

ARCHITECTURE FOR FPGAS

BACKGROUND OF THE INVENTION

1. Field of the Invention

The present invention relates to programmable circuits. More specifically, the present invention relates to programmable circuits having an integrated architecture for programing and testing a programmable circuit.

2. Description of Related Art

Programmable logic devices (PLDs) are integrated circuits which are increasingly used to provide logic for electronic systems. These devices can implement user-defined logic functions by interconnecting user-configurable logic cells through a variety of semiconductor switching elements. The switching elements may be programmable elements such as fuses or antifuses which can be programmed to respectively connect or disconnect logical circuits. As it is well known, a fuse is a device having two electrodes and a conductive element which electrically connects the two electrodes. When a fuse is programmed, by passage of sufficient current between its electrodes, the two electrodes are electrically disconnected. By contrast, an antifuse is a structure, having two electrodes, which are not electrically connected when unprogrammed. However, when programmed the first and second electrodes of the antifuse are permanently electrically connected. An antifuse can be programmed by applying sufficient voltage ("programming voltage") between its first and second electrodes, thereby forming a bi-directional conductive link between the first and the second electrodes. Due to the relatively large size of currents required to program anti fuses, the current configuration of programming and testing circuitry, for programmable circuits utilizing antifuses, has several limitations.

Figure 1:
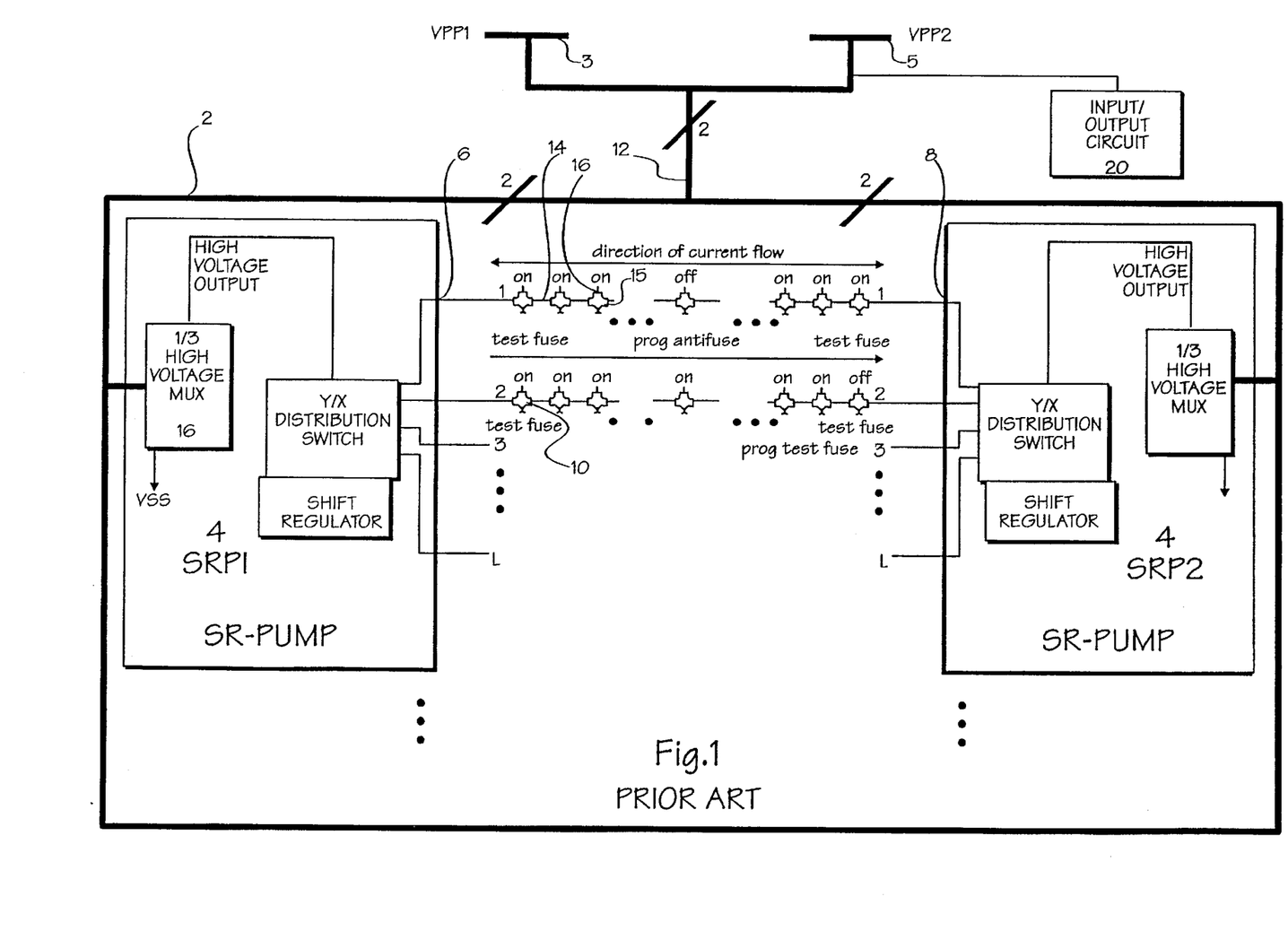
FIG. 1 shows a conventional programming and testing architecture for a programmable circuit.

FIG. 1 illustrates a programmable circuit 2 for programming and testing the circuitry of a Field Programmable Gate Array (FPGA) device. FPGAs are devices including arrays of programmable logic cells which can be interconnected by interconnect lines to generate complex functions which have multiple levels of logic. The interconnect lines of FPGAs typically include antifuses which can be programmed by coupling a high voltage to the antifuse to be programmed. In FIG. 1, supply pads 3 and 5 can be coupled to high voltage supplies Vpp1 and Vpp2. These supply pads are coupled to bus 12 which is routed around the chip to Shift Register Pumps (SRP) 4. The bus 12, in this particular example, is a two-line bus, having each of its lines connected to a different supply pad. The Shift Register Pumps are devices which can select a programmable line 14 and an antifuse 15 located on that routing line. The SRP 4 is also responsible for passing a large current through the anti fuse 15 thereby programming anti fuse 15. A multiplexing circuit 16, in this particular embodiment, selects either one of the supply voltages Vpp1, Vpp2, or Vss and couples the selected voltage to a programmable line 14. Generally to program an antifuse, a high voltage Vpp1 or Vpp2 is applied to one end 6 of the programmable line 14, and low voltage or ground is applied at the other end 8 of the programmable line 14, or vice versa. In theory, more than one programmable line could be coupled to the selected supply voltage Vpp. However, due to the large current required to program an anti fuse, in reality, only one programmable line is coupled to the supply voltage Vpp at one time. A more detailed discussion about the programming of antifuses can be found in U.S. Pat. No. 5,243,226 issued to Chan.

One problem with the circuit illustrated in FIG. 1 is that the input capacitance seen at the Vpp pads 3 and 5 is very large, approximately 40 pF. The input capacitance is very large because the Vpp pads 3 and 5 are directly coupled to the SRPs which have a very high capacitance. In the embodiment shown in FIG. 1, the bus 12 is routed over the entire chip to all the SRPs. Because the programming of antifuses requires high currents and voltages, the circuitry routed to the SRPs and the SRPs themselves have a very high capacitance. Since these Vpp pads are also utilized by users as input pins for accessing the input/output logic circuit 20, the large capacitance seen at the Vpp pads 3 and 5 directly interferes with the use of the input/output logic circuit 20.

Another problem with the circuit illustrated in FIG. 1 is related to test antifuses. Test antifuses 10 were inserted in each programmable line at both ends of each line to test the integrity of the programmable lines and of the SRPs. The integrity of a pump and of a programmable line could be tested by trying to blow the antifuse coupled, to the end of the line, remote from the respective SRP. However, by placing the test antifuses in the path of the programming current flowing through a programmable line, the amount of current flowing through the programmable line 14 would be reduced due to the impedance added by a test transistor coupled in parallel with the antifuse. Because the two additional test transistors coupled in parallel to the test antifuses would cause the impedance of the programmable line to increase, all the pass transistors coupled in parallel to the non-test antifuses had to be bigger to decrease the overall impedance of the programmable line such that a high enough programming current would flow through the programmable line. Consequently, the size of the conventional chip is affected by the larger non-test transistors required to compensate the increase in impedance caused by the test transistors.

Moreover, the test transistors required additional space on the chip due to the placement of these transistors in series with the programmable line. Furthermore, because test antifuses are coupled to the routing line that users utilize for connecting and accessing the logic on the chip the larger programming transistors, test antifuses, and test programming transistors add parasitic capacitance that negatively affects the performance of the chip.

Mother disadvantage of the circuit illustrated in FIG. 1 is that this circuit is limited to the programming of only two antifuses at one time. As explained above, to program antifuses, one needs to couple one Vpp pad to one end of the programmable line and ground or Vss to the other end of the programmable line. Because a large amount of current is required to program antifuses, one cannot program simultaneously more than one antifuse per programmable line. The circuit of FIG. 1 does not program more than one antifuse per SRP at one time, because it can only be connected to one VPP pad, or VSS. This causes the total programming time to be very high, considering that some chips have approximately 800,000 antifuses.

It is thus desirable to provide for a programmable circuit having an integrated programming and testing architecture which does not cause the input impedance seen by users to be very high. Additionally, it is desirable to provide an apparatus and method for programming programmable circuits wherein more than two programmable elements, such as an antifuse, can be programmed at one time. Also, it is desirable to provide an apparatus and method adapted to test programmable circuits wherein the test circuitry does not interfere with the projected size of the chip, the projected values of the programming current and voltage, the impedance of the routing line, or with the capacitance/performance of the routing lines.

SUMMARY OF THE INVENTION

The present invention provides a programmable circuit apparatus having a programmable circuit and first terminal. The programmable circuit apparatus includes a programming circuit, with a bus junction, for programming the programmable circuit. The programmable circuit apparatus further includes an isolation circuit having an isolation input, coupled to the first terminal, and an isolation output, coupled to the bus junction of the programming circuit. The isolation circuit further has an isolation control gate which can receive a control signal and in response controllably couples the isolation input to the isolation output.

The present invention also provides for a programmable circuit apparatus including a programmable circuit having first and second ends, and a programming circuit for driving a programming current through the programmable circuit and for programming with the programming current the programmable circuit. The programming circuit includes first and second programming terminals for coupling to respectively the first and second ends of the programmable circuit. The programmable circuit apparatus also includes a test circuit coupled between one of the first or second programming terminals and the reference terminal.

The present invention also provides for a programmable circuit apparatus including a programmable circuit having at least one programmable line having two ends. The programmable circuit apparatus further includes a programming circuit for programming the programmable circuit. The programming circuit includes one or more programming electrically conductive lines, each programming line having a first end for coupling to a dedicated programming voltage supply. The dedicated programming voltage supply is different for each programming line. The programming circuit also includes one or more programming units, each pair of programming units including a multiplexing device having an output coupled to one end of a programmable line. The multiplexing device further has an input for receiving the programming lines. The multiplexing device also has a control gate for receiving a control signal and in response to that signal for selecting at its output one of the programming lines.

BRIEF DESCRIPTION OF THE DRAWINGS

The features, aspects, and advantages of the present invention will become more fully apparent from the following detailed description, appended claims, and accompanying drawings in which:

DETAILED DESCRIPTION OF THE INVENTION

Numerous specific details are set forth in this description to provide a thorough understanding of the present invention. However, one having an ordinary skill in the art may be able to practice the invention without these specific details. In some instances, well-known circuits, structures, and techniques have not been shown in detail not to unnecessarily obscure the present invention.

Figure 2:
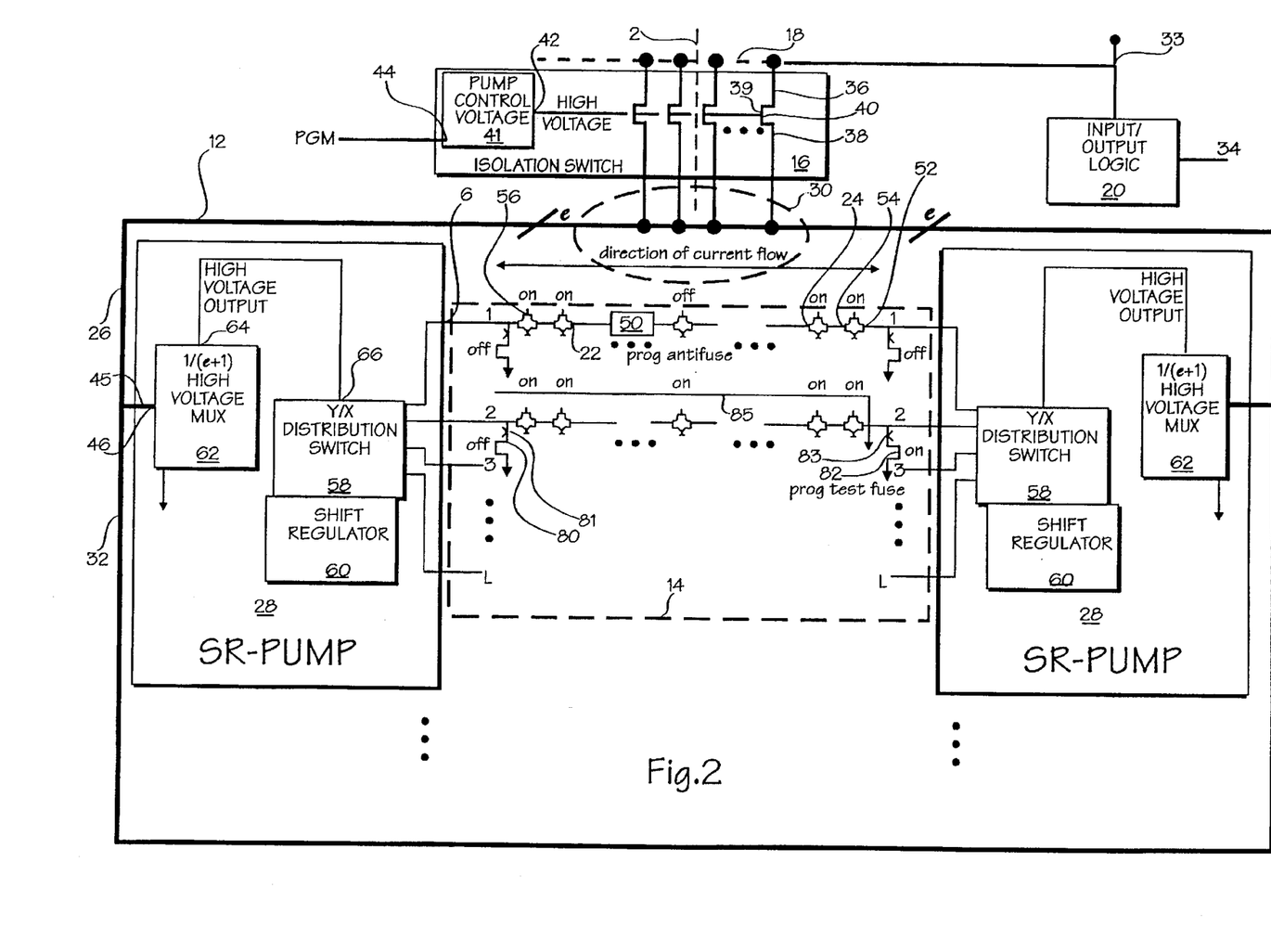
FIG. 2 shows a circuit for programming and testing a programmable circuit according to the present invention.

FIG. 2 illustrates a programmable circuit apparatus according to the present invention. The programmable circuit apparatus according to the present invention includes a programmable circuit 14 (shown in dotted line) which, in this particular embodiment, by way of non-limiting example, is a circuit for programming antifuses. The programmable circuit 14 includes at least one or more electrically conductive programmable lines 22. The programmable lines 22 include programmable devices 24 which, in this particular embodiment are, by way of non-limiting example, antifuses. Antifuses 24 can be programmed by setting programming circuit 12 in a mode where a programming current is driven through a programmable line 22 which contains the antifuse to be programmed.

Programming circuit 12 includes programming bus 26 and at least two programming units 28. The programming units 28 may also, alternatively, be denominated as Shift Register Pumps (SRP) in the following description. The programming bus 26 is a bus having one or more electrically conductive programming lines (not shown) routed along the periphery of the chip which includes the programmable circuit 14. These programming lines extend from the bus junction 30 to the programming units 28. The programming bus 26, which includes the programming lines 12, is shown in FIG. 2 as a continuous contour which encloses the programmable circuit 14. While in this particular embodiment the programming bus 26 has a substantially rectangular shape, this bus can have any other shape provided that it is coupled to each programming unit 28 on the chip.

The programmable circuit apparatus according to the present invention further includes an input/output logic circuit 20 coupled to one of Vpp pads 18. The input/output logic circuit 20 allows a user to access the programmable circuit 14 once this programmable circuit has been programmed. The input/output logic circuit 20 has a first terminal 33 coupled to one of Vpp pads 18. There can be multiple input/output logic circuits on the chip. One or more input/output logic can be coupled to any of the L Vpp pads. Some of the Vpp pads are not coupled to an input/output logic. Vpp pads 18 include at least one voltage supply pad which is coupled to a high voltage supply. In this figure, L Vpp pads are coupled to Vpp1–Vpp (not shown) for programming the programmable circuit 14 via the programming circuit 12.

The input/output logic is a circuit which is used to pass signals from the outside to the internal programmable logic and from the internal programmable logic to the outside. As mentioned above, conventional programming circuits had the first terminal 33 coupled directly to the programmable circuit 14 via the programming circuit 12 which has a very large capacitance. The input capacitance seen at the first terminal 33 was, thus, very large due to the direct coupling of this first terminal to the programming circuit 12.

The programmable circuit apparatus according to the present invention provides for an isolation circuit 16 which has one or more isolation inputs 36 coupled to Vpp pad/pads 18 and one or more isolation outputs 38 coupled to the programming circuit 12. The isolation circuit 16 further has a control gate 44 for receiving a control signal. In response to this signal, the control gate 44 can controllably couple the isolation input to the isolation output. The switching device 40, in this particular embodiment, is a MOS transistor. Accordingly, the input of the isolation circuit 16 includes the drain 36 of one or more MOS transistors 40, while the output of the isolation circuit 16 includes the source 38 of these transistors. Each transistor 40 has a gate 39 which is coupled to a control voltage pump 41. Control voltage pump 41 has a gate which coincides with control gate 44. In response to a control signal received at control gate 44, the control voltage pump 41 outputs a signal at output gate 42, which is coupled to the gate 39 of transistor 40.

Figure 3:
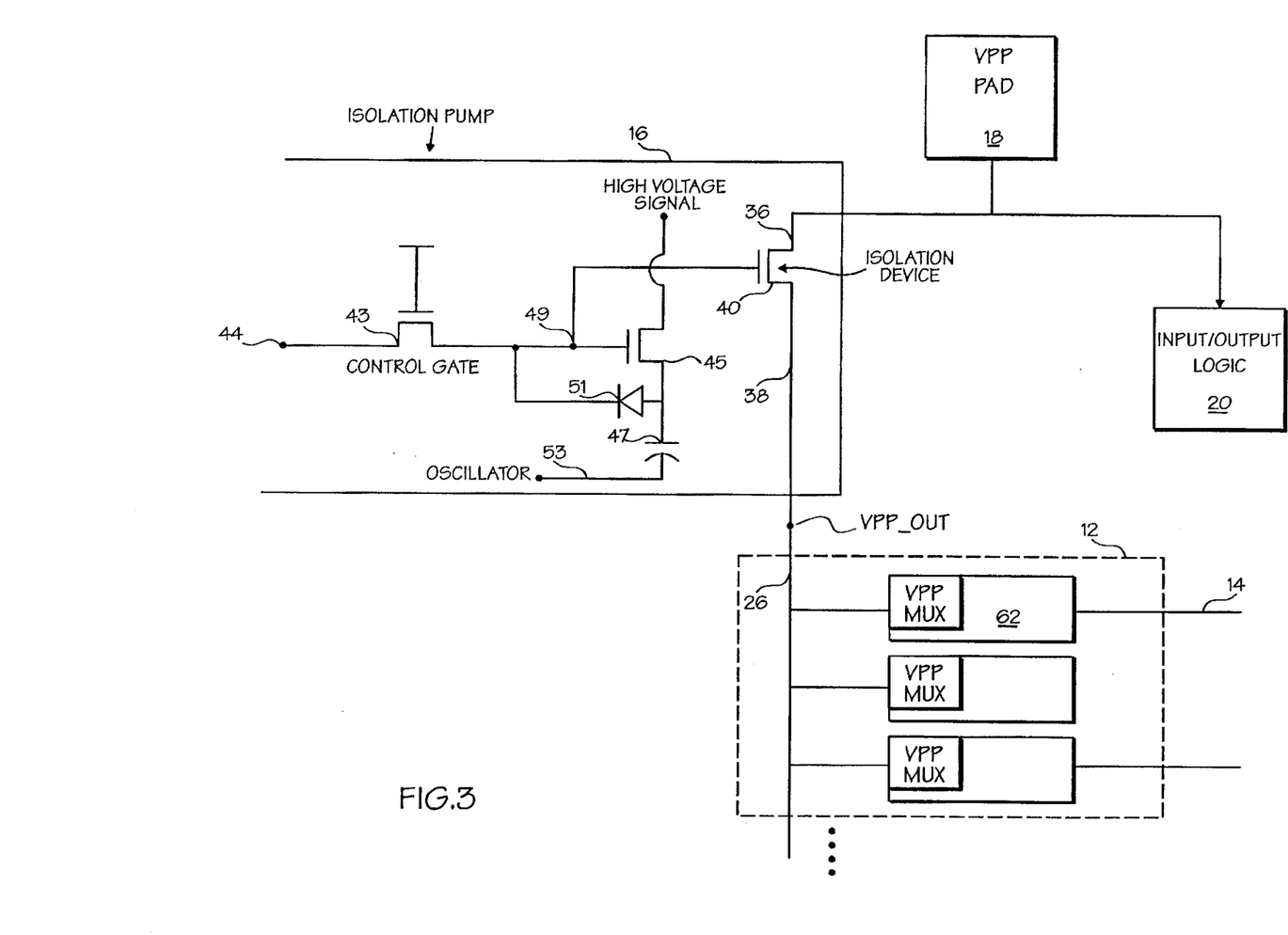
FIG. 3 illustrates in detail a control voltage pump according to the present invention.

FIG. 3 is a detailed illustration of the control voltage pump 41 coupled to the transistor 40. As one can see in this Figure, the switching device 40 is a MOS transistor having its drain coupled to the Vpp pad 18 and to the input/output logic circuit 20. The transistor 40 can be turned on or off according to the control signal applied at the control gate 44. According to this signal, transistor 40 can be switched on thereby coupling one of the Vpp pads 18 to one of the programming lines 22 (not shown) of the programming bus 26. Alternatively, transistor 40 can be switched off, thereby de-coupling the programming bus 26 and the shift register pumps 28 from the Vpp pad 18 and the input/output circuit 20. In this particular embodiment, the control voltage pump 41 can be by way of example a charge pump. The function of the charge pump circuit in this embodiment, is to raise the voltage at the node 49, which is coupled to the gates of both transistor 45 and transistor 40, beyond a predetermined voltage value, thereby coupling the drain 36 of transistor 40 to the source 38 of this transistor. When the capacitor 47 is charged via transistor 45 by means of the oscillator signal 53 to a voltage which exceeds the voltage at the node 49 plus the voltage required for the diode 51 to conduct, the voltage at the node 49 will increase as the capacitor 47 keeps charging up. When the voltage at the gate 49 exceeds a voltage equal or higher to the voltage at the source of transistor 40 plus the threshold voltage of transistor 40, transistor 40 will couple the Vpp pad 18 to the respective programming line corresponding to transistor 40. However, when the difference between the voltage at the node 49 and the voltage at the source of the transistor 40 is less than the threshold voltage of the transistor 40, transistor 40 will decouple the input pad 18 from the programming circuit (12). Accordingly, the capacitance seen at the first terminal 33 (shown in FIG. 1) will be substantially lower than in the case where this first terminal was directly coupled to bus 26 and to programming units 28, as it is shown in FIG. 2.

Going back to FIG. 2, the apparatus according to the present invention includes the programming circuit 12 for programming a programmable circuit 14. The programming circuit 12 includes the programming bus 26 which can have a plurality of programming lines, each programming line being coupled to the source 38 of one MOS transistor 40 via bus junction 30. From bus junction 30, programming lines are routed onto the chip to at least one of the programming units 28.

Each programming unit 28 includes an input gate 46 and an output gate 48. The input gate is coupled to one or more programming lines via a programming node 45. The output 48 of the programming unit 28 is coupled to at least one programmable line 22. In this particular embodiment, the output of gate 48 of the programming unit 28 is coupled to N individual programmable lines 22. The N programmable lines 22 include at least one antifuse 24. Each antifuse 24 has two electrodes 52 and 54. The electrode 52 is proximal to a first end of the programmable line 22, the first end being located at the intersection of the line and the programming unit shown at the right in this figure. The electrode 54 is proximal to a second end of the programmable line 22, the second end being located at the intersection of the line and the programming unit shown at the left in FIG. 2. Additionally, pass transistors 56 are coupled in parallel with each antifuse 24. Pass transistors 56 can be, by way of non-limiting example, FET transistors. Such a FET transistor has a drain coupled to one electrode 52 of antifuse 24 and a source coupled to the other electrode 54 of antifuse 24. A gate of transistor 56 is typically coupled to a third programming unit via a gate line (not shown in this Figure). When an antifuse is programmed, the transistor 56, in parallel with that anti fuse, will be switched OFF. The programming current will, thus, flow through the respective antifuse to be programmed via the programmable line 22 wherein the rest of the pass transistors on this line will be switched ON to allow a flow of programming current to the antifuse to be programmed.

The programming unit 28 includes a driver circuit 58, labeled "distribution switch" in FIG. 2, for driving a programming current through programmable lines 22. The circuit 58 for driving the programmable lines 22 can be by way of non-limiting example, a driver circuit. This circuit has an output which coincides with the output of the unit 28. The output of the driver circuit 58, in this particular example is coupled to L different programmable lines 22. The programming unit 28 further includes a shift register circuit 60 for controlling the programmable lines to be programmed. According to a control bit (not shown) stored in the shift register circuit 60, the driver circuit 58 will drive or will not drive a programmable line 22 coupled to this driver circuit. The driver circuit 58 can also be coupled to a gate line (not shown in this figure). Gate lines are electrically conductive lines which couple the driver circuit 58 to a gate of a pass transistor. The programming unit 28 further includes multiplexing circuit 62 which is a high voltage multiplexer having an input 46 coupled to the programmable bus 26 via the programming node 45. Multiplexer 62 further includes aft output 64 which is coupled to an input 66 of the driver circuit 58.

Figure 4A:
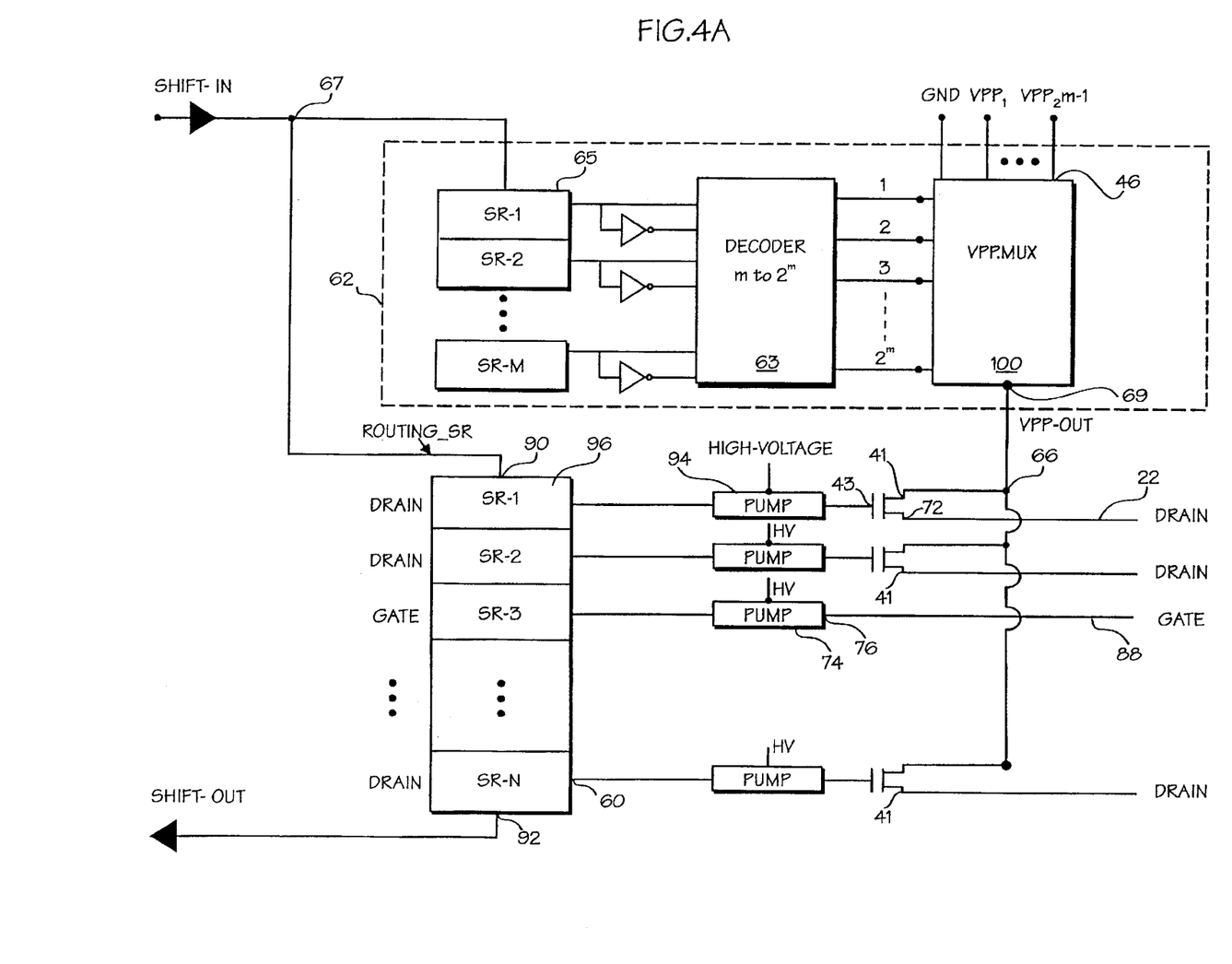
FIG. 4a illustrates in detail the structures and interconnections of the shift register pump according to the present invention.

FIG. 4a illustrates in more detail the structures, included in the programming unit 28, and their interconnections. A SHIFT IN pin, accessible outside the chip, is coupled via a node 67 to a multiplexer shift register circuit 65 and to the driver shift register circuit 60. Data can be serially shifted via the SHIFT IN pin to either of the two shift registers depending on the mode used. The multiplexer shift register 65 is configured during a load control mode, and the drive shift register 60 is configured during shift mode. Shift register 65 is used in conjunction with a decoder 63 for selecting one of the programming lines Vpp 1–Vpp L. Accordingly, a selected programming line coupled to the input 46 of the multiplexer 62 will be output at the output gate 69 of the multiplexer 62. The output of the multiplexer 62 is coupled via node 66 to the drains of transistors 41. Transistors 41 are drive transistors which have a gate coupled to a drive pump 94 and a source 72 coupled to programmable lines 22. The programmable lines 22 are further coupled to the drains of the transistors 56 (not shown in this figure).

FIG. 4a also shows gate pump 74 which is coupled at its output 76 to a gate line 88. A gate line is typically coupled to the gate of a pass transistor 56 (not shown). When the voltage at the output 76 of the gate pump 74 is set at a logic level "0," the gate of the respective pass transistor, coupled in parallel to an antifuse to be programmed, is switched off such that the respective antifuse can be programmed by a programming current driven by the driver transistor 41. If the transistor 41 is switched on, a Vpp line is coupled to the drain of transistor 41 thereby providing a programming current to the antifuse to be programmed.

Figure 4B:
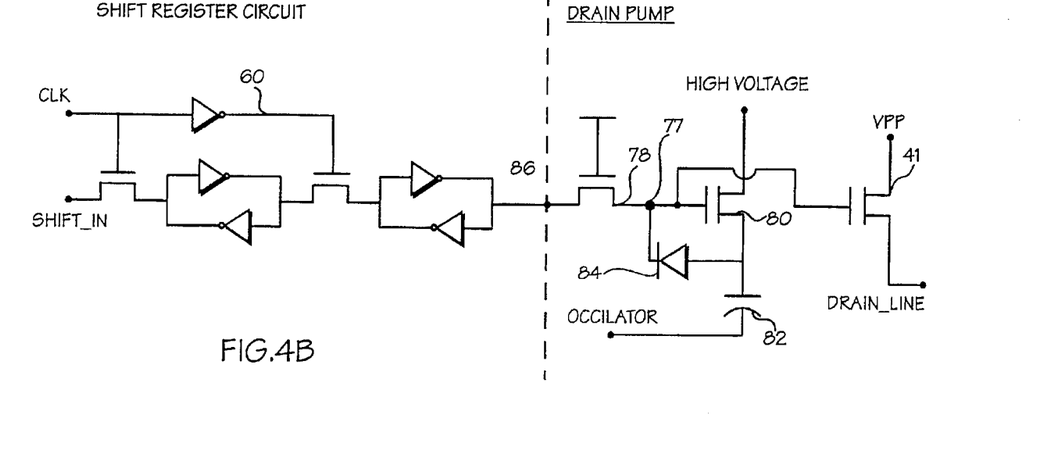
FIG. 4b illustrates a drain pump circuit according to the present invention.
Figure 4C:
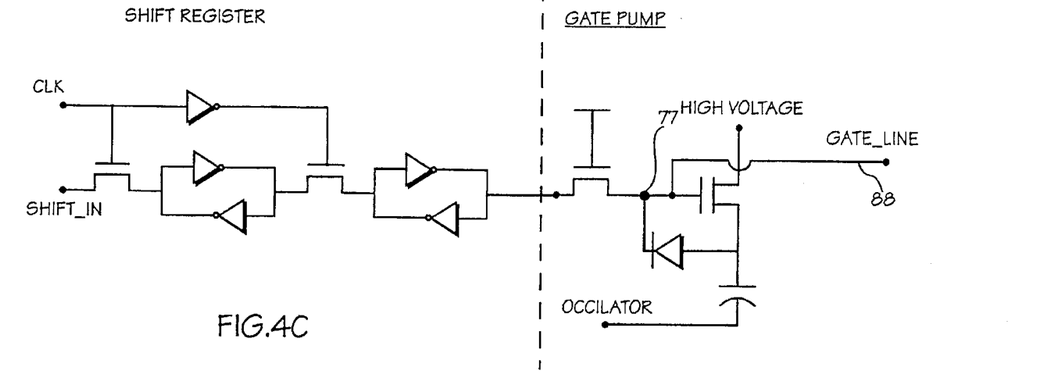
FIG. 4c illustrates a gate pump circuit according to the present invention.

FIG. 4b shows a drain pump coupled to the gate of the drive transistor 41. As one can see, transistor 78 can receive at its source 86 a signal from the shift register circuit 60 which can be either a logic "0" or a logic 'T'. Accordingly, the signal at node 77, which is coupled to both the gate of transistor 80 and the gate of transistor 41, will be set at a voltage which can switch the transistor 41 ON, thereby allowing the Vpp voltage at the drain of transistor 41 to drive the drain line coupled to the source of transistor 41. Similarly, FIG. 4c shows a gate pump which is typically coupled to line 88 in FIG. 4a. The gate pump works in a substantially similar way as the drain pump shown in FIG. 4b, with the exception that node 77, instead of being coupled to the gate of transistor 41, is coupled directly to a gate line.

FIG. 4a further shows the shift register 60 which is also coupled to the SHIFT IN pin shown in that figure. Logical data is serially shifted in via the input gate 90 and is shifted out via the output gate 92. Depending on whether an antifuse coupled to one of the drive transistors 41 is to be programmed, a respective cell 96, of shift register 60, is configured to contain a logic "1." Similarly, the gate of the pass transistor in parallel with the antifuse to be programmed will be coupled to a logic "0" by shifting a logic "0" in a cell coupled to the gate line 88 corresponding to that pass transistor.

Generally, for each pair of programming units 28 spaced apart from each other and having a programmable line 22 coupled between these programming units, as shown in FIG. 2, only one antifuse positioned on programmable line 22 can be programmed at one time. The multiplexer 62, shown in FIG. 2, can couple only one of its high voltage Vpp inputs to its output. Furthermore, only one programmable line 22 is selected by means of shift register 60 to be programmed at one time. The programming units 28 can be configured such that only the Vpp pad is operatively coupled to the programming units at a time. The apparatus and method according to the present invention thus offers the possibility of simultaneously programming up to L antifuses, as long as L Vpp pads are coupled via L programming lines to at least L of the 2 L shift register pumps 28 available. According to this scheme, two separate programming units 28, are coupled respectively to Vpp and to Vss or ground. An antifuse positioned on a programmable line 22, coupled at each of its ends to the pair of programming units 28, can be accordingly programmed. Moreover, according to this scheme L antifuses, coupled to L programmable lines, each programmable line being coupled to a different pair of programming units, can be programmed simultaneously.

FIG. 2 further shows test transistors 80 and 82 according to the present invention. Each one of these test transistors coupled in series to, respectively, test antifuses 81 and 83 forming a test circuit. This test circuit provides a means for testing the continuity of the programmable circuit, functionality of the programming circuit and programming threshold of the programmable circuit with a minimum impact on performance. The source of the test transistors is connected to the ground or Vss. Test antifuse 81 is coupled at one of its electrodes to the drain of test transistor 80 and at another electrode to the output 48 of the driver circuit 58. The test transistor 82 and the test fuse 83 are coupled in a similar fashion to the driver circuit 58, located at the right side on FIG. 2. According to this configuration, one could test the integrity of line 85 and of the SRP 28 positioned at the left of FIG. 2 by configuring transistor 80 to be OFF, all the transistors on programmable line 85 to be ON, and test transistor 82 to be ON. If the current driven by the shift register pump located on the left side of FIG. 2 passes through the entire programmable line 85 and further flows through the anti fuse 83 and programs it, then one can assume that all pass transistors 56, on line 85, and the shift register pump 28 located at the left of FIG. 2 are in order. Similarly, one can perform the same testing by configuring the transistor 80 to be on and the transistor 82 to be off and drive a current through line 85 from the shift register pump positioned at the right hand side on FIG. 2. Also, the test circuit including antifuse 81 and transistor 80 can be configured such that the test transistor 80 is coupled directly to the programming unit 28 and the test antifuse is coupled to the ground. Furthermore, the test transistor 80 shown in Figure L can be coupled to another programming unit instead of being coupled to ground.

Test transistor 82, associated with testing antifuse 83, for example, can be a tenth of the size of the test transistors used in conventional schemes, where test antifuses were positioned on the programmable line in series with other antifuses. The test transistors 80 and 82 do not have to have the same size as the programmable transistor 56 because the current flowing through the test transistors can be lower than the current otherwise required for programming an antifuse. In this configuration, the amount of current that a test transistor has to withstand is not so critical, as in the conventional scheme, since the test transistors are no longer in the path of the programming current. Because the test antifuse and, thus, the test transistor are not positioned in series with the programmable antifuses 24, the impedance of the programmable line will not be affected by the test transistors. Consequently, the programmable transistors 56 do not have to be bigger than their size in the absence of the test transistors in the programmable circuit. Accordingly, less space will be taken up by test transistors because the size of the test transistor is substantially smaller than the size of the programmable transistors 56. The performance of the chip also increases due to the fact that the capacitance associated with a test transistor and antifuse is much smaller.

Figure 5:
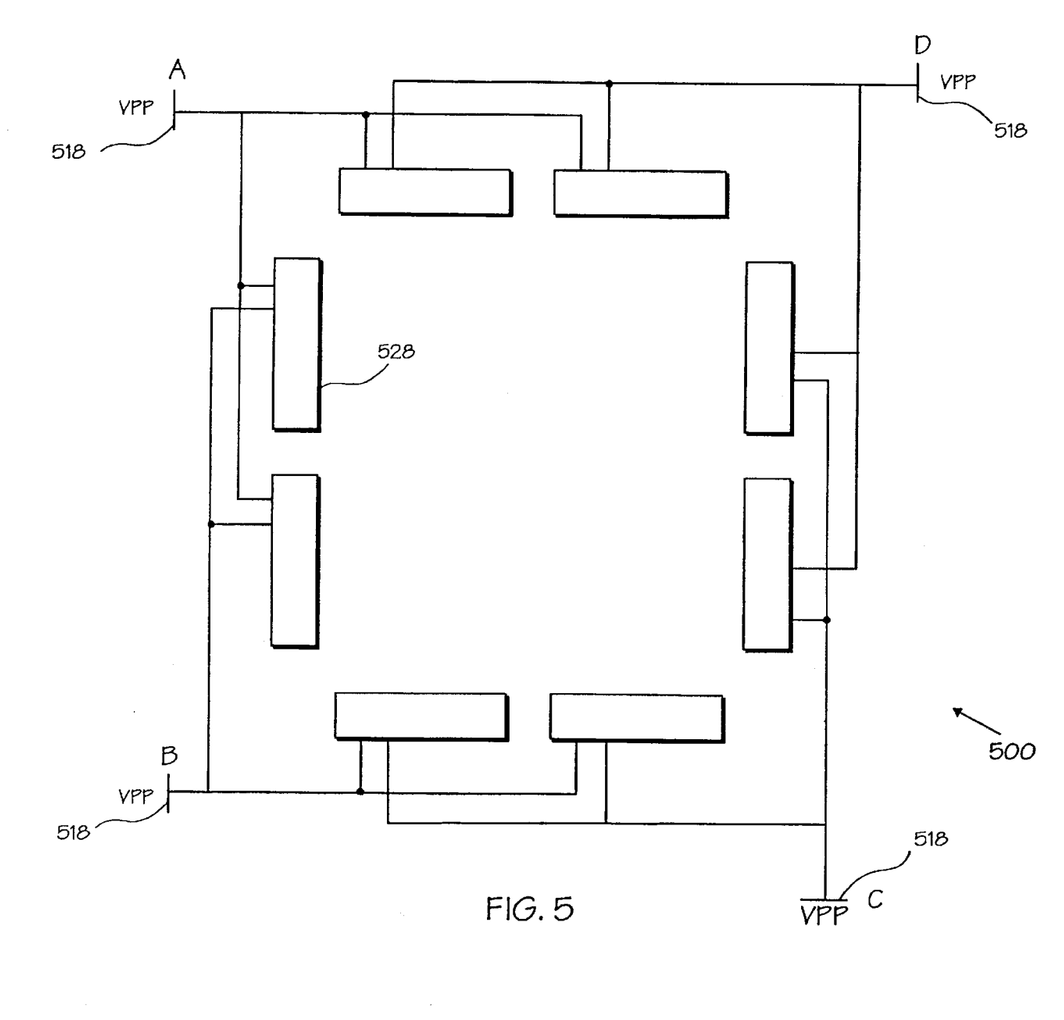
FIG. 5 illustrates an alternative embodiment of programmable circuit apparatus according to the present invention.

FIG. 5 illustrates an alternative embodiment according to the present invention. According to this embodiment the Vpp pads 518 are not routed to all the programming unit 528 of the programmable circuit apparatus 500. Rather, according to this scheme each Vpp pad, such as the Vpp pad A, by way of example, is routed to four programming units positioned on two adjacent sides of the square or rectangle contour formed by the programming units 528. This configuration provides the advantage of saving die area by having the programming bus 526 routed only to a limited part of the chip and not to all the chip. Moreover this configuration allows the use of multiplexers, in the programming units 528, which take up a smaller area of the chip, as these multiplexers have to multiplex only two signals instead of four signals which otherwise would be required if each Vpp pad in FIG. 5 had to be connected to every programming units shown in this figure. The programmable circuit apparatus shown in FIG. 5 can utilize the same isolation scheme shown in FIGS. 2, 3, 4a, 4b and 4c. Similarly the apparatus shown in FIG. 5 can utilize the same test circuitry shown in FIG. 2. Accordingly the features described in conjunction with FIGS. 2, 3, 4a, 4b and 4c are incorporated herein by reference.

While the present invention has been particularly described with reference to the various figures and embodiments, it should be understood that these are for illustration only and should not be taken as limiting the scope of the invention. Many changes and modifications may be made to the invention by one having Ordinary skill in the art, without departing from the spirit and scope of the invention.

What is claimed is:

1. A programmable circuit apparatus having a programmable circuit and a first terminal, said apparatus comprising:

a programming circuit for programming said programmable circuit, said programming circuit having a bus junction; and an isolation circuit having an isolation input, coupled to said first terminal, and an isolation output, coupled to said bus junction of said programming circuit, said isolation circuit further having an isolation control gate for receiving a control signal and responsive thereto for controllably coupling said isolation input to said isolation output.

2. The apparatus of claim 1 wherein said isolation circuit further includes, a controllable switching device including a switch input, coupled to said isolation input, a switch output coupled to said isolation output, and a switch control gate; and a control voltage pump having an input and an output, said output being coupled to said switch control gate, wherein said controllable switching device couples said switch input to said switch output when said switch control gate is set to a first predetermined control voltage.

3. The apparatus of claim 2 wherein said controllable switching device decouples said switch input from said switch output when said switch control gate is set to a second predetermined voltage value.

4. The apparatus of claim 3 wherein an input capacitance measured, between said first terminal, and a reference terminal, when said switch input is coupled to said switch output, is substantially greater than the capacitance measured between said first terminal and said reference terminal, when said switch input is decoupled from said switch output.

5. The apparatus of claim 2 wherein said programming circuit includes, at least one programming electrically conductive line coupled to said bus junction, said programming electrically conductive line further having at least one programming node; and at least one programming unit, each programming unit having an input and an output, wherein, said programming unit is coupled to said programming node.

6. The apparatus of claim 5 wherein said programmable circuit includes at least one programmable electrically conductive line having first and second ends, said first end being coupled to a first programming unit, at an output thereof, said second end being coupled to a second programming unit, at an output thereof, said first and second ends having disposed there between at least an antifuse, said antifuse having a first electrode proximal to said first end, said anti fuse further having a second electrode proximal to said second end.

7. The apparatus of claim 6 wherein said programmable circuit further includes one or more pass transistors, each pass transistor being coupled in parallel with one of each of said antifuses, each pass transistor having a control terminal.

8. The apparatus of claim 7 wherein each programming unit includes, a shift register circuit for storing at least one control bit, said shift register circuit having a shift register output, driver circuit for driving at least one programmable electrically conductive line, said circuit for driving having an input, at least one output, and a control terminal for controlling said output, said input being coupled to one programming electrically conductive line, said output being coupled to one programmable electrically conductive line, and said control terminal being coupled to said shift register output.

9. The apparatus of claim 10 wherein each programming unit further includes a multiplexing circuit, having an input and an output, for selectively supplying at said output thereof one of a plurality of high voltage signals, said high voltage signal selectively supplied at said output of said multiplexing circuit being specified by a multiplexer shift register, said output of said multiplexing circuit being coupled to said input of said driver circuit.

10. The apparatus of claim 9 wherein said programmable circuit comprises a Field Programmable Gate Array (FPGA).

11. The apparatus of claim 10 wherein said controllable switching device includes a MOS transistor having a source biased at a source voltage.

12. The apparatus of claim 11 wherein said first predetermined control voltage is substantially equal to said source voltage and a threshold voltage of a MOS transistor.

13. A programmable circuit apparatus comprising:

a programmable circuit having first and second ends;

a programming circuit for driving a programming current through said programmable circuit and for programming with said programming current said programmable circuit, said programming circuit having first and second programming terminals for coupling to respectively said first and second ends of said programmable circuit; and a test circuit coupled between one of said first or second programming terminals and a reference terminal.

14. The programmable circuit apparatus of claim 13 wherein said test circuit has a control test terminal for setting said test circuit in either a test mode wherein a test current is passed through said test circuit, or in a non-test mode wherein no programming current flows through said test circuit.

15. The apparatus of claim 14 wherein said test circuit includes a test antifuse and a test transistor, said test antifuse being coupled in series with said test transistor.

16. The apparatus of claim 15 wherein said test antifuse has one end coupled to said first end of the programmable circuit, said test antifuse having a second end coupled to a drain of said test transistor, said test transistor having a source coupled to the ground, said test transistor further having a gate, coupled to said control test terminal, for switching said test transistor between said test mode and said non-test mode.

17. The apparatus of claim 15 wherein said programming circuit further includes first and second programming units, said test antifuse having one end coupled to said first programming unit and another end coupled to a drain of said test transistor, said test antifuse having an end not coupled to ground but coupled to said second programming unit.

18. The apparatus of claim 17 wherein said programmable circuit further includes at least one programmable conductive line having first and second ends, said first and second ends having disposed there between at least an anti fuse, said antifuse having a first electrode proximal to said first end, said antifuse further having a second electrode proximal to said second end said.

19. A programmable circuit apparatus having a programmable circuit having first and second ends and a first terminal, said apparatus comprising:

a programming circuit for driving a programming current through said programmable circuit and for programming, with said programming current, said programmable circuit, said programming circuit having a bus junction, said programming circuit further having first and second programming terminals for coupling to respectively said first and second ends of said programmable circuit;

a test circuit coupled between one of said first or second programming terminals and a reference terminal; and an isolation circuit having an isolation input, coupled to said first terminal, and an isolation output, coupled to said bus junction of said programming circuit, said isolation circuit further having an isolation control gate for receiving a control signal and responsive thereto for controllably coupling said isolation input to said isolation output.

20. A programmable circuit apparatus comprising:

a programmable circuit having first and second ends;

a programming circuit for driving a programming current through said programmable circuit and for programming, with said programming current, said programmable circuit, said programming circuit having first and second programming terminals for coupling to respectively said first and second ends of said programmable circuit, said programming circuit further including, one or more programming electrically conductive lines, each programming line having a first end for coupling to a dedicated programming voltage supply, said dedicated programming voltage supply being different for each programming line, one or more programming units, each programming unit including a multiplexing device having an output coupled to one end of a programmable line, said multiplexing device further having an input for receiving said programming lines, said multiplexing device further having a control gate for receiving a control signal and responsive thereto for selectively supplying at said output thereof one of said programming lines; and a test circuit coupled between one of said first or second programming terminals and a reference terminal.

21. A programmable circuit apparatus having a programmable circuit and a first terminal, said programmable circuit having at least one programmable line with two ends said apparatus comprising:

a programming circuit for programming said programmable circuit, said programming circuit having a bus junction, said programming circuit further including, one or more programming electrically conductive lines, each programming line having a first end for coupling to a dedicated programming voltage supply, said dedicated programming voltage supply being different for each programming line, one or more programming units, each programming unit including a multiplexing device having an output coupled to one end of a programmable line, said multiplexing device further having an input for receiving said programming lines, said multiplexing device further having a control gate for receiving a control signal and responsive thereto for selectively supplying at said output thereof one of said programming lines; and an isolation circuit having an isolation input, coupled to said first terminal, and an isolation output, coupled to said bus junction of said programming circuit, said isolation circuit further having an isolation control gate for receiving a control signal and responsive thereto for controllably coupling said isolation input to said isolation output.

22. A programmable circuit apparatus having a programmable circuit and an input/output circuit with a first terminal, said apparatus comprising:

a programming circuit for programming said programmable circuit, said programming circuit having a bus junction; and an isolation circuit having an isolation input, coupled to said first terminal, and an isolation output, coupled to said bus junction of said programming circuit, said isolation circuit further having an isolation control gate for receiving a control signal and responsive thereto for controllably coupling said isolation input to said isolation output.

* * * * *

UNITED STATES PATENT AND TRADEMARK OFFICE
CERTIFICATE OF CORRECTION

PATENT NO. : 5,656,949
DATED : August 12, 1997
INVENTOR(S) : Yip, et al

It is certified that error appears in the above-identified patent and that said Letters Patent is hereby corrected as shown below:

In column 1 at lines 7-8 delete "programing" and insert --programming--

In column 2 at line 42 delete "Mother" and insert --Another--

In column 5 at line 62 delete "lines" and insert --line--

In column 6 at line 38 delete "aft" and insert --an--

In column 7 at line 7 delete "T" and insert --1--

UNITED STATES PATENT AND TRADEMARK OFFICE
CERTIFICATE OF CORRECTION

PATENT NO. : 5,656,949
DATED : August 12, 1997
INVENTOR(S) : Yip, et al

It is certified that error appears in the above-identified patent and that said Letters Patent is hereby corrected as shown below:

In column 10 at line 41 delete "drcuit" and insert --circuit--

In column 11 at line 2 delete "drcuit" and insert --circuit--

In column 11 at line 8 delete "drcuit" and insert --circuit--

Signed and Sealed this

Sixth Day of January, 1998

Attest:

BRUCE LEHMAN

Attesting Officer        Commissioner of Patents and Trademarks